US008772777B2

(12) United States Patent
Lee et al.

(10) Patent No.: US 8,772,777 B2
(45) Date of Patent: Jul. 8, 2014

(54) ORGANIC LIGHT-EMITTING DISPLAY DEVICE AND METHOD OF MANUFACTURING THE SAME

(75) Inventors: June-Woo Lee, Yongin-si (KR); Sung-Ho Kim, Yongin-si (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 434 days.

(21) Appl. No.: 13/158,632

(22) Filed: Jun. 13, 2011

(65) Prior Publication Data
US 2012/0138936 A1 Jun. 7, 2012

(30) Foreign Application Priority Data
Dec. 3, 2010 (KR) .......................... 10-2010-0122580

(51) Int. Cl.
*H01L 31/00* (2006.01)
*H01L 21/336* (2006.01)
(52) U.S. Cl.
USPC .. 257/59; 257/79; 257/E21.41; 257/E33.062; 438/22; 438/151
(58) Field of Classification Search
USPC .................... 257/40, 57, 59, 79, 84, E33.062, 257/E21.41; 438/22, 29, 34, 151, 171
See application file for complete search history.

(56) References Cited

U.S. PATENT DOCUMENTS

| 7,666,695 B2* | 2/2010 | Jeoung et al. ................... 438/34 |
| 7,714,328 B2* | 5/2010 | Miyazawa ....................... 257/59 |
| 7,906,898 B2* | 3/2011 | Lee ................................ 313/504 |
| 7,910,414 B2* | 3/2011 | Choi et al. ..................... 438/158 |
| 2009/0257492 A1* | 10/2009 | Andersson et al. ....... 375/240.12 |
| 2013/0037818 A1* | 2/2013 | Lee et al. ......................... 257/72 |

FOREIGN PATENT DOCUMENTS

| KR | 10-2006-0011970 | 2/2006 |
| KR | 10-2006-0055211 | 5/2006 |
| KR | 10-2009-0092731 | 9/2009 |
| KR | 10-0932938 | 12/2009 |

* cited by examiner

*Primary Examiner* — Tuan N. Quach
(74) *Attorney, Agent, or Firm* — Robert E. Bushnell, Esq.

(57) ABSTRACT

In an organic light-emitting display device and a method of manufacturing the same, the organic light-emitting display device comprises: a substrate in which a light-emitting region and a thin-film transistor (TFT) region are defined; and a plurality of insulating films formed on the substrate. A refractive index changes at only one of the interfaces between insulating films, which correspond to the light-emitting region and are formed between the substrate and a first electrode of an organic electroluminescence display element, and a refractive index changes at two or more of the interfaces between insulating films which correspond to the TFT region.

20 Claims, 8 Drawing Sheets

ORGANIC LIGHT-EMITTING DISPLAY DEVICE AND METHOD OF MANUFACTURING THE SAME

CLAIM OF PRIORITY

This application makes reference to, incorporates the same herein, and claims all benefits accruing under 35 U.S.C. §119 from an application earlier filed in the Korean Intellectual Property Office on the $3^{rd}$ of Dec. 2010 and there duly assigned Serial No. 10-2010-0122580.

BACKGROUND OF THE INVENTION

1. Field of the Invention

The present invention relates to an organic light-emitting display device and a method of manufacturing the same and, more particularly, to an organic light-emitting display device having thin-film transistor (TFT) characteristics and viewing angle characteristics which are improved without an additional exposure process, and a method of manufacturing the organic light-emitting display device.

2. Description of the Related Art

In general, flat panel display (FPD) devices are classified into organic devices and inorganic devices according to the type of material used. Examples of inorganic devices include plasma display panel (PDP) using photoluminescence (PL) from phosphors and field emission display (FED) devices using cathode luminescence (CE). Examples of organic devices include liquid crystal display (LCD) devices and organic electroluminescence display devices.

Organic light-emitting display devices including organic electroluminescence display elements can realize moving images since they have higher response speed than the currently widely used LCDs. In addition, being self-luminous, organic light-emitting display devices have a wide viewing angle and high luminance. Due to these advantages, organic light-emitting display devices are considered the as the next-generation display devices.

In an organic light-emitting display device, a plurality of insulating films are formed between a pixel electrode and a substrate. In that regard, different insulating films may be required for right-emitting characteristics and thin-film transistor (TFT) characteristics.

SUMMARY OF THE INVENTION

The present invention provides an organic light-emitting display device having improved thin-film transistor (TFT) characteristics and viewing angle characteristics.

The present invention also provide a method of manufacturing an organic light-emitting display device having TFT characteristics and viewing angle characteristics which are improved without an additional exposure process.

However, aspects of the present invention are not restricted to the one set forth herein. The above and other aspects of the present invention will become more apparent to one of ordinary skill in the art to which the present invention pertains by referencing the detailed description of the present invention given below.

According to an aspect of the present invention, an organic light-emitting display device comprises: a substrate in which a light-emitting region and a TFT region are defined; and a plurality of insulating films formed on the substrate; wherein a refractive index changes at, only one of the interfaces between insulating films, which correspond to the light-emitting region and are formed between the substrate and a first electrode of an organic electroluminescence display element, among the plurality of insulating films, and a refractive index changes at two or more of the interfaces between insulating films, which correspond to the TFT region, among the plurality of insulating films.

According to another aspect of the present invention, a method of manufacturing an organic light-emitting display device comprises the steps of: sequentially forming a first insulating film, which includes a stack of a first sub-insulating film and a second sub-insulating film, and a film for forming a semiconductor layer on a substrate in which a light-emitting region and a TFT region are defined; forming a first photoresist pattern on the film for forming the semiconductor layer; etching the film for forming the semiconductor layer, the second sub-insulating film, and the first sub-insulating film using the first photoresist pattern as an etch mask; removing the first photoresist pattern and then sequentially forming a second insulating film, which includes a stack of a third sub-insulating film and a fourth sub-insulating film, and a conductive film for forming a gate electrode on an entire surface of the substrate having a semiconductor layer; forming a second photoresist pattern on the conductive film for forming the gate electrode; and etching the conductive film for forming the gate electrode and the fourth sub-insulating film using the second photoresist pattern as an etch mask.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
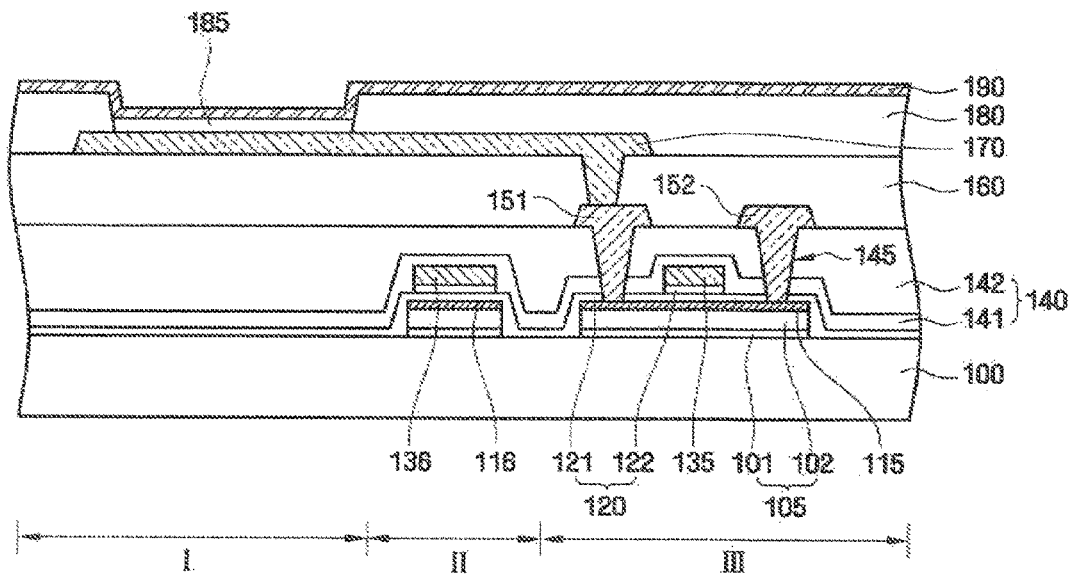
FIG. 1 is a cross-sectional view of an organic light-emitting display device according to an exemplary embodiment of the present invention.

Advantages and features of the present invention and methods of accomplishing the same may be understood more readily by reference to the following detailed description of exemplary embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. In the drawings, sizes and relative sizes of elements may be exaggerated for clarity.

Like reference numerals refer to like elements throughout the specification. As used herein, the term "and/or" includes any and all combinations of one or more of the associated listed items.

The terminology used herein is for the purpose of describing particular embodiments only and is not intended be limit the invention. As used herein, the singular forms are intended to include the plural forms as well, unless the context clearly indicates otherwise. It will be further understood that the terms "comprises" and/or "made of," when used in this specification, specify the presence of stated components, steps, operations, and/or elements, but do not preclude the presence or addition of one or more other components, steps, operations, elements, and/or groups thereof.

It will be understood that, although the terms first, second, third, etc., may be used herein to describe various elements, these elements should not be limited by these terms. These terms are only used to distinguish one element from another element. Thus, a first element discussed below could be termed a second element without departing from the teachings of the present invention.

Embodiments of the invention are described herein with reference to plan and cross-section illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Thus, the regions illustrated in the figures are schematic in nature, and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art, and should not be interpreted in an idealized or overly formal sense unless expressly so defined herein.

Hereinafter, an organic light-emitting display device according to an exemplary embodiment of the present invention will be described with reference to FIG. 1.

FIG. 1 is a cross-sectional view of an organic light-emitting display device according to an exemplary embodiment of the present invention. In the current exemplary embodiment, a bottom emission organic light-emitting display device in which light exits toward a lower substrate will be described.

Referring to FIG. 1, a substrate 100 may be made of a material which allows light to pass therethrough. For example, the substrate 100 may be made of transparent glass having $SiO_2$ as a main component or a transparent polymer material such as polymethylmethacrylate (PMMA), polyaniline (PANI), or polyethylene terephthalate (PET). Alternatively, the substrate 100 may be a flexible metal plate made of, e.g., SUS, W, or Ti. The substrate 100 may be divided into a light-emitting region I from which light emitted from a light-emitting layer 185 exits, a capacitor region II in which a capacitor is formed, and a thin-film transistor (TFT) region III in which a TFT is formed.

A first insulating film 105 is formed in the capacitor region II and the TFT region III of the substrate 100. The first insulating film 105 includes a first sub-insulating film 101 and a second sub-insulating film 102 stacked sequentially. The first sub-insulating film 101 may be made of $SiN_x$ or SiON, and the second sub-insulating film 102 may be made of $SiO_2$. The first sub-insulating film 101 prevents the penetration of mobile ions into a channel region of a semiconductor layer 115. In a subsequent heat treatment process, hydrogen atoms contained in the first sub-insulating film 101 replace dangling bonds which serve as trap sites in the channel region of the semiconductor layer 115, thereby increasing the operating speed of a TFT. The second sub-insulating film 102 separates the semiconductor layer 115 from the first sub-insulating film 101 by a predetermined gap.

The first insulating film 105 is not formed in the light-emitting region I. The absence of the first insulating film 105 from the light-emitting region I can remove resonance which may occur between the substrate 100, the first sub-insulating film 101, and the second sub-insulating film 102. In the current exemplary embodiment, the first sub-insulating film 101 and the second sub-insulating film 102 are formed using the same photoresist pattern as for the semiconductor layer 115 and a capacitor first electrode 116 so as to have the same pattern shape as the semiconductor layer 115 and the capacitor first electrode 116.

The semiconductor layer 115 is formed on the second sub-insulating film 102 of the TFT region III, and the capacitor first electrode 116 is formed on the second sub-insulating film 102 of the capacitor region II. The semiconductor layer 115 may be made of polycrystalline silicon. The capacitor first electrode 116 may be made of the same material as the semiconductor layer 115.

A second insulating film 120 is formed on the substrate 100 having the semiconductor layer 115 and the capacitor first electrode 116. The second insulating film 120 includes a third sub-insulating film 121 and a fourth sub-insulating film 122 stacked sequentially. The third sub-insulating film 121 may be made of $SiO_2$, and the fourth sub-insulating film 122 may be made of $SiN_x$, SiON, or a high-k film. Examples of the high-k film include $TiO_2$, $Nb_2O_5$, $H_fO_2$, $ZrO_2$, and $Ta_2O_5$. The third sub-insulating film 121 is formed in the light-emitting region I, capacitor region II, and TFT region III of the substrate 100. On the other hand, the fourth sub-insulating film 122 is not formed in the light-emitting region 1. The fourth sub-insulating film 122 having a higher dielectric constant than the third sub-insulating film 121 is required in the capacitor region II and the TFT region III in order to secure a sufficient thickness of the second insulating film 120 used as a gate insulating film. However, the fourth sub-insulating film 122 is not formed in the light-emitting region I to remove resonance which may occur between the substrate 100, the third sub-insulating film 121, and the fourth sub-insulating film 122.

In the current exemplary embodiment, the fourth sub-insulating film 122 may be formed using the same photoresist patterns as for a gate electrode 135 and a capacitor second electrode 136 so as to have the same pattern shape as the gate electrode 135 and the capacitor second electrode 136.

The gate electrode 135 is formed on the fourth sub-insulating film 122 of the TFT region III, and the capacitor second electrode 136 is formed on the fourth sub-insulating film 122 of the capacitor region II. The gate electrode 135 may contain one or more conductive materials selected from the group consisting of Ag, Mg, Al, Pt, Pd, Au, Ni, Nd, Ir, Cr, Li, Ca, Mo, Ti, W, MoW, and Al/Cu. The capacitor second electrode 136 may be made of the same material as the gate electrode 135.

A third insulating film 140 is formed on the substrate 100 having the gate electrode 135 and the capacitor second electrode 136. The third insulating film 140 may be formed in the light-emitting region I, the capacitor region. II, and the TFT region III of the substrate 100. The third insulating film 140 includes a fifth sub-insulating film 141 and a sixth sub-insulating film 142 stacked sequentially. The fifth sub-insulating film 141 may be made of $SiO_2$, and the sixth sub-insulating film 142 may be made of $SiN_x$ or SiON.

Source and drain electrodes 151 and 152, respectively, are formed on the sixth sub-insulating film 142 of the TFT region III. The source and drain electrodes 151 and 152, respectively, may be electrically connected to the semiconductor layer 115 by contact holes 145 formed in the third insulating film 140 and the third sub-insulating film 121. The source and drain electrodes 151 and 152, respectively, may contain one or more conductive materials selected from the group consisting of Ag, Mg, Al, Pt, Pd, Au, Ni, Nd, Ir, Cr, Li, Ca, Mo, Ti, W, MoW, and Al/Cu.

A fourth insulating film 160 is formed on the substrate 100 having the source and drain electrodes 151 and 152, respectively. The fourth insulating film 160 may be a single layer and may be made of $SiN_x$ or SiON. The fourth insulating film 160 may be formed in the light-emitting region I, the capacitor region II, and the TFT region III of the substrate 100.

A first electrode 170 of an organic electroluminescence display element is formed on the fourth insulating film 160. The first electrode 170 may be an anode and a transmissive electrode. The first electrode 170 may contain one or more transparent materials selected from the group consisting of ITO, IZO, ZnO, and $In_2O_3$.

A fifth insulating film 180 is formed on the first electrode 170. The fifth insulating film 180 exposes a predetermined region of the first electrode 170 such that the light-emitting layer 185 is formed on the exposed region of the first electrode 170. The fifth insulating film 180 may contain one or more organic insulating materials selected from the group consisting of polyimide, polyamide, acrylic resin, benzocyclobutene, and phenol resin. The fifth insulating film 180 defines a pixel and prevents an electric field from being concentrated on the edge of the first electrode 170, thereby averting a short circuit between the first electrode 170 and a second electrode 190.

The light-emitting layer 185 is formed in the region of the first electrode 170 which is exposed by the fifth insulating film 180. The light-emitting layer 185 emits light when biases are applied to the first electrode 170 and the second electrode 190. Functional layers known in the art may further be provided between the first electrode 170 and the second electrode 190 in order to facilitate the movement of electrons and holes from the first electrode 170 and the second electrode 190 to the light-emitting layer 185. Examples of the functional layers include a hole injection layer, a hole transport layer, an electron blocking layer, a hole blocking layer, an electron transport layer, and an electron injection layer. The light-emitting layer 185 and the functional layers may be made of any material known in the art.

The second electrode 190 of the organic electroluminescence display element is formed on the substrate 100 having the light-emitting layer 185. The second electrode 190 may be a cathode and a reflective electrode. The second electrode 190 may be made of Ag, Mg, Al, Pt, Pd, Au, Ni, Nd, Ir, Cr, Li, Ca, LiF/Ca, LiF/Al, or a compound of these materials.

In the current exemplary embodiment, the first sub-insulating film 101 made of $SiN_x$ or SiON and the fourth sub-insulating film 122 made of $SiN_x$, SiON or a high-k film are removed from the light-emitting region I. Therefore, the refractive index changes only at an interface between the fifth sub-insulating film 141 made of $SiO_2$ and the sixth sub-insulating film 142 made of $SiN_x$ or SiON, among interfaces between the insulating films 160, 140 and 121 disposed between the substrate 100 and the first electrode 170. Accordingly, no resonance structure is formed between a lower surface of the first electrode 170 and the substrate 100 in the light-emitting region I, thus increasing a viewing angle of the organic light-emitting display device in which light is emitted from the substrate 100. For example, in the organic light-emitting display device according to the exemplary embodiment of FIG. 1, changes in chromaticity coordinates according to angles are reduced by approximately 35%. Therefore, the organic light-emitting display device exhibits better viewing angle characteristics than those of an organic light-emitting display device having the first sub-insulating film 101, which may be made of $SiN_x$ or SiON, and the fourth sub-insulating film 122, which may be made of $SiN_x$, SiON or a high-k film, unremoved from the light-emitting region I.

The first sub-insulating film 101 made of $SiN_x$ or SiON and the fourth sub-insulating film 122 made of $SiN_x$, SiON or a high-k film are left unremoved from the capacitor region II and the TFT region III. Therefore, the operating speed of a TFT can be increased, and a sufficient thickness of the second insulating film 120 used as a gate insulating film can be secured as described above. For example, a TFT of the organic light-emitting display device according to the exemplary embodiment of FIG. 1 has a lower s-factor than that of a TFT of an organic light-emitting display device in which the first sub-insulating film 101 made of $SiN_x$ or SiON and the fourth sub-insulating film 122 made of $SiN_x$, SiON, or a high-k film are removed from the TFT region III. Therefore, the TFT of the organic light-emitting display device of FIG. 1 exhibits better operating speed characteristics.

In the current exemplary embodiment, for process simplification, the first sub-insulating film 101 and the second sub-insulating film 102 are formed using the same photoresist pattern as for the semiconductor layer 115 and the capacitor first electrode 116 so as to have the same pattern shape as the semiconductor layer 115 and the capacitor first electrode 116. In addition, the fourth sub-insulating film 122 is formed using the same photoresist pattern as for the gate electrode 135 and the capacitor second electrode 136 so as to have the same pattern shape as the gate electrode 135 and the capacitor second electrode 136.

Hereinafter, an organic light-emitting display device according to another exemplary embodiment of the present invention will be described with reference to FIG. 2.

Figure 2:
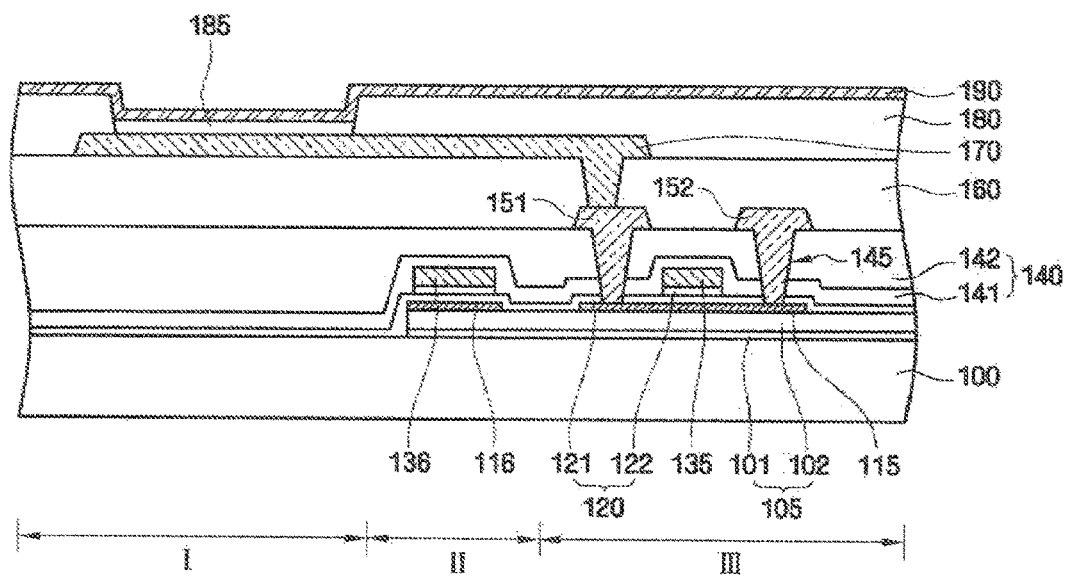
FIG. 2 is a cross-sectional view of an organic light-emitting display device according to another exemplary embodiment of the present invention.

FIG. 2 is a cross-sectional view of an organic light-emitting display device according to another exemplary embodiment of the present invention. Elements substantially identical to those illustrated in FIG. 1 are indicated by like reference numerals, and a detailed description thereof will be omitted.

Referring to FIG. 2, the organic light-emitting display device according to the current exemplary embodiment is different from the organic light-emitting display device according to the exemplary embodiment of FIG. 1 in that a first insulating film 105 does not have the same pattern shape as a semiconductor layer 115 and a capacitor first electrode 116. That is, the first insulating film 105 may be formed as a larger pattern than the semiconductor layer 115 and the capacitor first electrode 116. In this case, insulating films formed on the semiconductor layer 115 and the capacitor first electrode 116 can better cover ends of the semiconductor layer 115 and the capacitor first electrode 116, thus further improving leakage current characteristics of a TFT.

Hereinafter, a method of manufacturing the organic light-emitting display device according to the exemplary embodiment of FIG. 1 will be described with reference to FIGS. 1 and 3 thru 7.

FIGS. 3 thru 7 are cross-sectional views illustrating intermediate processes of a method of manufacturing the organic light-emitting display device according to the exemplary embodiment of FIG. 1.

Figure 3:
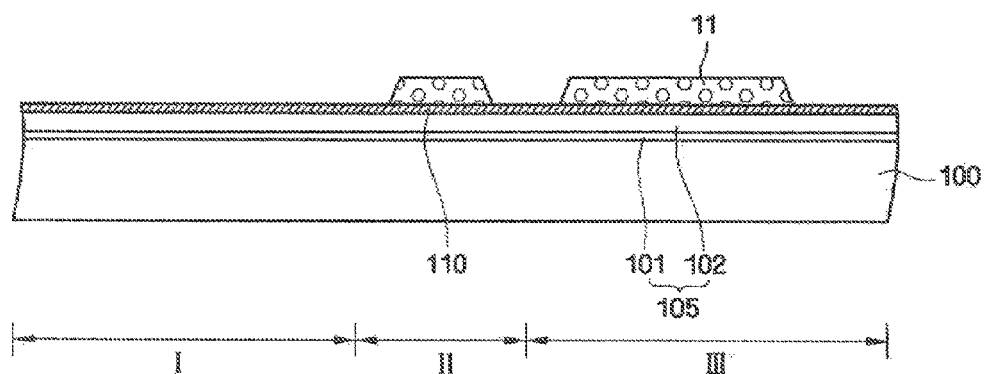
FIGS. 3 thru 7 are cross-sectional views illustrating intermediate processes of a method of manufacturing the organic light-emitting display device according to the exemplary embodiment of FIG. 1.

Referring to FIG. 3, a first insulating film 105 and a film 110 for forming a semiconductor layer are sequentially formed on a substrate 100. The first insulating film 105 may be formed by depositing a first sub-insulating film 101 made of $SiN_x$ or SiON on the substrate 100 and depositing a second sub-insulating film 102 made of $SiO_2$ on the first sub-insulating film 101. The first sub-insulating film 101 and the second sub-insulating film 102 may be deposited using various deposition methods known in the art, such as plasma enhanced chemical vapor deposition (PECVD), atmospheric pressure chemical vapor deposition (APCVD), and low pressure chemical vapor disposition (LPCVD).

The film 110 for forming the semiconductor layer may be made of polycrystalline silicon which is obtained by depositing amorphous silicon and then crystallizing the amorphous silicon. The amorphous silicon may be crystallized using various methods such as rapid thermal annealing (RTA), solid phase crystallization (SPC), excimer laser annealing (ELA), metal induced crystallization (MIC), metal induced lateral crystallization (MILC), and sequential lateral solidification (SLS).

A first photoresist pattern 11 for forming a semiconductor layer 115 (see FIG. 1) and a capacitor first electrode 116 (see FIG. 1) is formed on the film 110 for forming the semiconductor layer.

Figure 4:
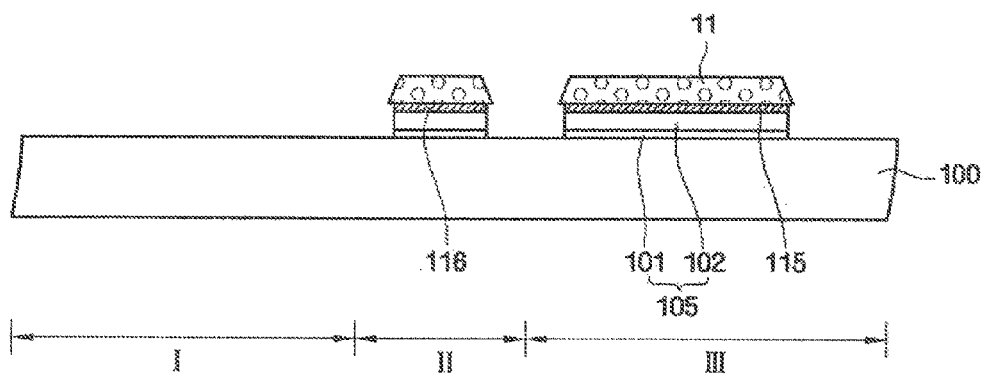

Referring to FIG. 4, the film 110 for forming the semiconductor layer, the second sub-insulating film 102, and the first sub-insulating film 101 is etched using the first photoresist pattern 11 as an etch mask. The etching process may be performed using various known methods, such as wet etching and dry etching. The second sub-insulating film 102 and the first sub-insulating film 101 can be etched together, depending the etchant or the etching gas.

Figure 5:
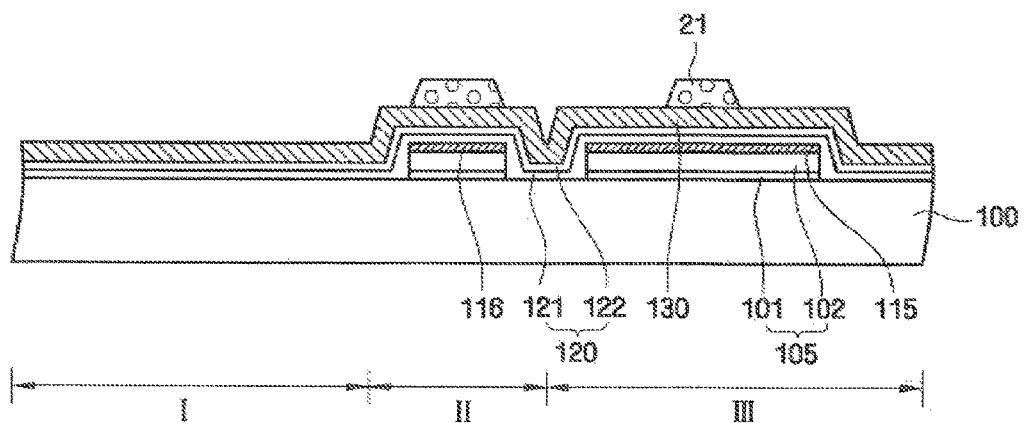

Referring to FIG. 5, the first photoresist pattern 11 is removed, and then a second insulating film 120 and a conductive film 130 for forming a gate electrode are sequentially formed on the entire surface of the substrate 100 having the semiconductor layer 115 and the capacitor first electrode 116. The second insulating film 120 is formed by depositing a third sub-insulating film 121 made of $SiO_2$ on the substrate 100 and depositing a fourth sub-insulating film 122 made of $SiN_x^2$, SiON or a high-k film on the third, sub-insulating film 121. The third sub-insulating film 121 and the fourth sub-insulating film 122 may be deposited using various known deposition methods such as PECVD, APCVD, and LPCVD. The conductive film 130 for forming the gate electrode may be formed by depositing one or more conductive materials selected from the group consisting of Ag, Mg, Al, Pt, Pd, Au, Ni, Nd, Ir, Cr, Li, Ca, Mo, Ti, W, MoW, and Al/Cu using various deposition methods known in the art.

A second photoresist pattern 21 for forming a gate electrode 135 (see FIG. 1) and a capacitor second electrode 136 (see FIG. 1) is formed on the conductive film 130 for forming the gate electrode.

Figure 6:
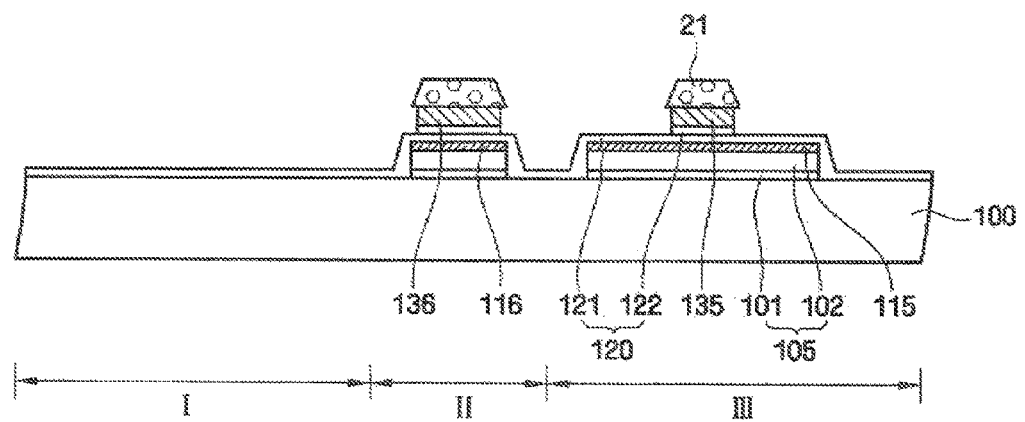

Referring to FIG. 6, the conductive film 130 for forming the gate electrode and the fourth sub-insulating film 122 are etched using the second photoresist pattern 21 as an etch mask. The fourth sub-insulating film 122 may be dry-etched using an etching gas having a high etch selectivity with respect to the third sub-insulating film 121. For example, when a CF4-based etching gas is used, only the fourth insulating film 122 can be etched.

Figure 7:
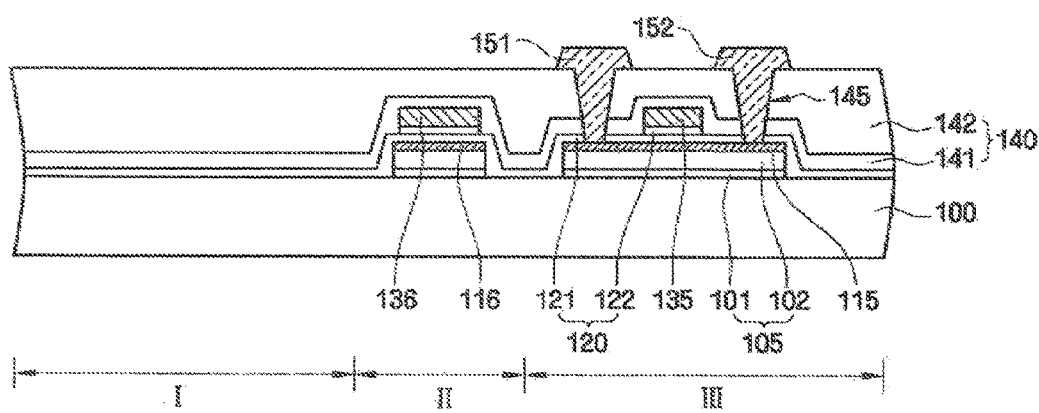

Referring to FIG. 7, the second photoresist pattern 21 of FIG. 6 is removed, and then a third insulating film 140 is formed on the entire surface of the substrate 100 having the gate electrode 135 and the capacitor second electrode 136. The third insulating film 140 is formed by depositing a fifth sub-insulating film 141 made of $SiO_2$ on the substrate 100 and depositing a sixth sub-insulating film 142 made of $SiN_x$ or SiON on the fifth sub-insulating film 141. The fifth sub-insulating film 141 and, the sixth sub-insulating film 142 may be deposited using various known deposition methods such as PECVD, APCVD, and LPCVD.

Next, contact holes 145 exposing portions of the semiconductor layer 115 are formed in the third insulating film 140 and the third sub-insulating film 121. A conductive film for forming source and drain electrodes is formed on the entire surface of the substrate 100 having the contact holes 145, and is patterned to form source and drain electrodes 151 and 152, respectively. The conductive film for forming the source and drain electrodes may be formed by depositing one or more conductive materials selected from the group consisting of Ag, Mg, Al, Pt, Pd, Au, Ni, Nd, Ir, Cr, Li, C Mo, Ti, W, MoW, and Al/Cu using various deposition methods known in the art. In addition, the conductive film for forming the source and drain electrodes may be etched using various known methods such as wet etching and dry etching.

Referring to FIG. 1, a fourth insulating film 160 is formed on the entire surface of the substrate 100 having the source and drain electrodes 151 and 152, respectively. The fourth insulating film 160 may be formed by depositing $SiN_x$ or SiON using various known deposition methods such as PECVD, APCVD and LPCVD. Next, a hole exposing a portion of one of the source and drain electrodes 151 and 152, respectively, is formed in the fourth insulating film 160. In addition, a conductive film for forming a first electrode of an organic electroluminescence display element is formed by depositing a transparent material, such as ITO, IZO, ZnO, or $In_2O_3$, on the entire surface of the substrate 100. Then, the conductive film for forming the first electrode is etched to form a first electrode 170 of an organic electroluminescence display element.

Next, a fifth insulating film 180 is formed by depositing one or more organic insulating materials selected from the group consisting of polyimide, polyamide, acrylic resin, benzocyclobutene, and phenol resin on the first electrode 170 using a method such as spin coating. A predetermined region of the fifth insulating film 180 is removed to expose a predetermined region of the first electrode 170. Then, a light-emitting layer 185 is formed on the predetermined region of the first electrode 170 which is exposed by the fifth insulating film 180. The light-emitting layer 185 may be made of an organic material known in the art, and may be formed using a conventional method such as inkjet printing, spin coating, or thermal transfer using a laser.

Next, a second electrode 190 of the organic electroluminescence display element is formed on the entire surface of the substrate 100 having the light-emitting layer 185. The second electrode 190 may be made of Ag, Mg, Al, Pt, Pd, Au, Ni, Nd, Ir, Cr, Li, Ca, LiF/Ca, LiF/Al, or a compound of these materials.

In the current exemplary embodiment, the first and second sub-insulating films 101 and 102, which may form a resonance structure when left unremoved from the light-emitting region I, are removed from the light-emitting region I using a photoresist pattern for forming the semiconductor layer 115 and the capacitor first electrode 116. Additionally, the fourth sub-insulating film 122 is removed from the light-emitting region I using a photoresist pattern for forming the gate electrode 135 and the capacitor second electrode 136. Therefore, no additional exposure process is required for the removal of the first and second sub-insulating films 101 and 102, respectively, and the fourth sub-insulating film 122.

Hereinafter, a method of manufacturing the organic light-emitting display device according to the exemplary embodiment of FIG. 2 will be described with reference to FIGS. 2 and 8 thru 11.

FIGS. 8 thru 11 are cross-sectional views illustrating intermediate processes of a method of manufacturing the organic light-emitting display device according to the exemplary embodiment of FIG. 2.

Figure 8:
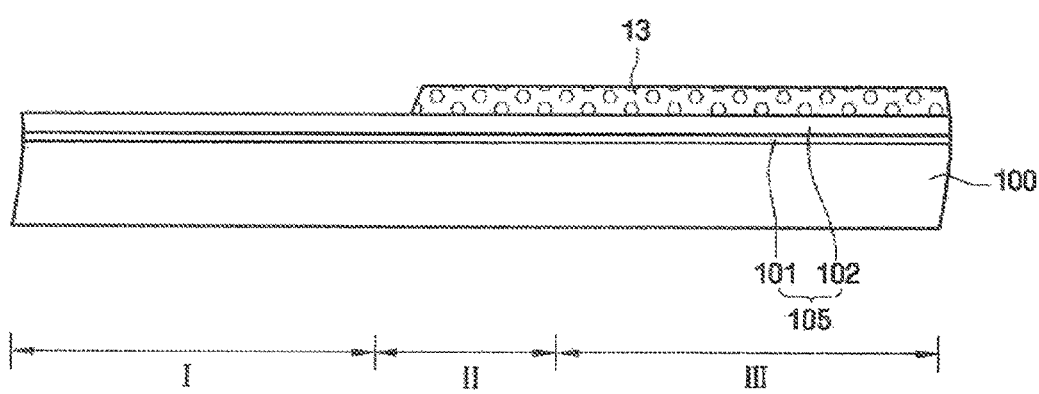
FIGS. 8 thru 11 are cross-sectional views illustrating intermediate processes of a method of manufacturing the organic light-emitting display device according to the exemplary embodiment of FIG. 2.

Referring to FIG. 8, a first insulating film 105 is formed by depositing a first sub-insulating film 101 made of $SiN_x$ or SiON on a substrate 100 and depositing a second sub-insulating film 102 made of $SiO_2$ on the first sub-insulating film 101. Then, a third photoresist pattern 13 exposing a light-emitting region I is formed on the second sub-insulating film 102.

Figure 9:
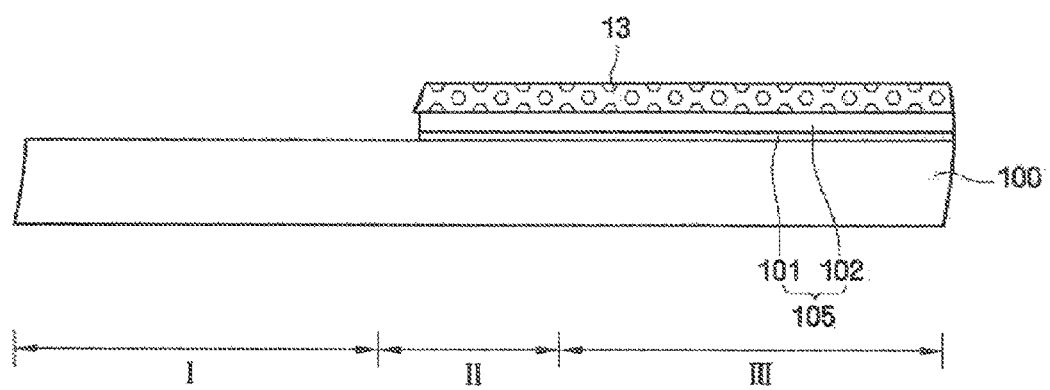

Referring to FIG. 9, the first sub-insulating film 101 and the second sub-insulating film 102 are etched using the third photoresist pattern 13 as an etch mask.

Figure 10:
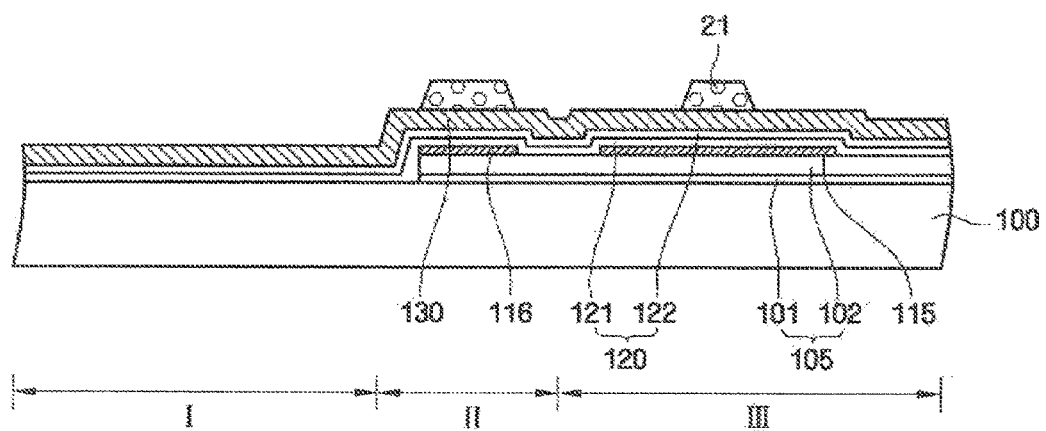

Referring to FIG. 10, the third photoresist pattern 13 of FIG. 9 is removed. Then, a semiconductor layer 115 and a capacitor first electrode 116 are formed on the substrate 100 having the first insulating film 105. Specifically, amorphous silicon is deposited on the substrate 100 having the first insulating film 105 and is crystallized to form polycrystalline silicon. Then, a photoresist pattern is formed on the polycrystalline silicon, and the polycrstyalline silicon is patterned using the photoresist pattern as an etch mask, thereby forming the semiconductor layer 115 and the capacitor first electrode 116.

Next, a second insulating film 120 and a conductive film 130 for forming a gate electrode are sequentially formed on the entire surface of the substrate 100 having the semiconductor layer 115 and the capacitor first electrode 116. The second insulating film 120 is formed by depositing a third sub-insulating film 121 made of $SiO_2$ on the substrate 100 and depositing a fourth sub-insulating film 122 made of $SiN_x$, SiON or a high-k film on the third sub-insulating film 121. A second photoresist pattern 21 for forming a gate electrode 135 (see FIG. 2) and a capacitor second electrode 136 (see FIG. 2) is formed on the conductive film 130 for forming the gate electrode.

Figure 11:
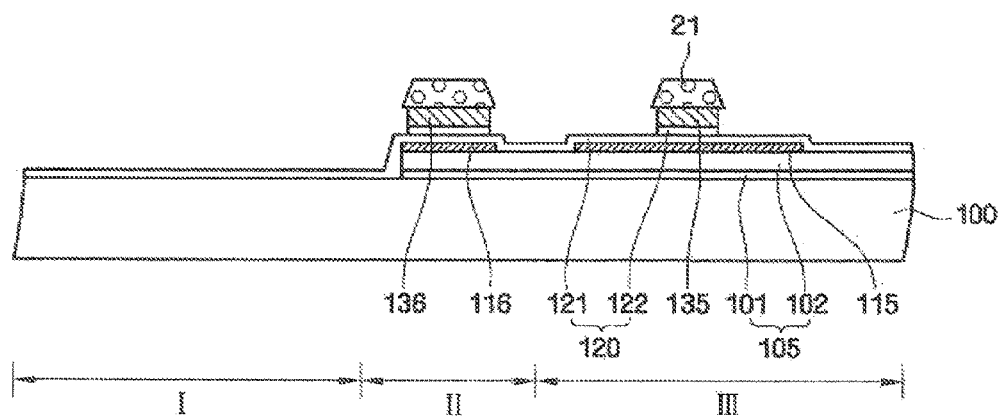

Referring to FIG. 11, the conductive film 130 for forming the gate electrode and the fourth sub-insulating film 122 are etched using the second photoresist pattern 21 as an etch mask. The fourth sub-insulating film 122 may be etched using an etchant or an etching gas having a high etch selectivity with respect to the third sub-insulating film 121.

Referring to FIG. 2, after the second photoresist pattern 21 of FIG. 11 is removed, a third insulating film 140, source and drain electrodes 151 and 152, respectively, a fourth insulating film 160, a first electrode 170, a fifth insulating film 180, a light-emitting layer 185, and a second electrode 190 are sequentially formed. The above-described method of manufacturing the organic light-emitting display device according to the exemplary embodiment of FIG. 1 can be referred to for a detailed description of a method of forming these elements.

Hereinafter, another method of manufacturing the organic light-emitting display device according to the exemplary embodiment of FIG. 2 will be described with reference to FIGS. 2 and 10 thru 15.

FIGS. 12 thru 15 are cross-sectional views illustrating intermediate processes of another method of manufacturing the organic light-emitting display device according to the exemplary embodiment of FIG. 2.

Figure 12:
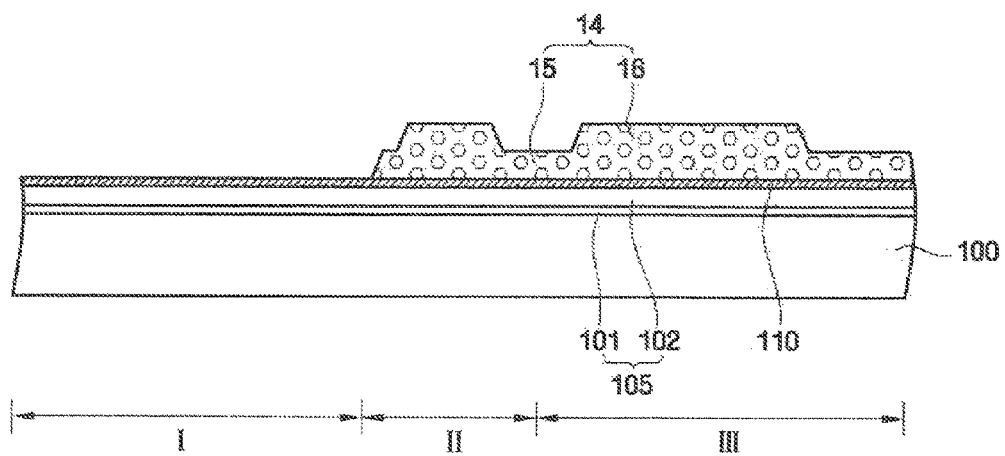
FIGS. 12 thru 15 are cross-sectional views illustrating intermediate processes of another method of manufacturing the organic light-emitting display device according to the exemplary embodiment of FIG. 2.

Referring to FIG. 12, a first insulating film 105 is formed by depositing a first sub-insulating film 101 made of $SiN_x$ or SiON on a substrate 100, and depositing a second sub-insulating film 102 made of $SiO_2$ on the first sub-insulating film 101. Then, a film 110 for forming a semiconductor layer is formed of polycrystalline silicon by depositing an amorphous silicon layer on the second sub-insulating film 102 and crystallizing the amorphous silicon layer.

Next, a fourth photoresist pattern 14 is formed on the film 110 for forming the semiconductor layer. The fourth photoresist pattern 14 consists of two regions 15 and 16 having different thicknesses and is not formed in the light-emitting region I. The thick region 16 of the fourth photoresist pattern 14 covers an area in which a semiconductor layer 115 (see FIG. 2) and a capacitor first electrode (see FIG. 2) are formed, and the thin region 15 covers an area in which the first insulating film 105 (see FIG. 2) is left unremoved. The fourth photoresist pattern 14 may be formed using a slit mask or a halftone mask.

Figure 13:
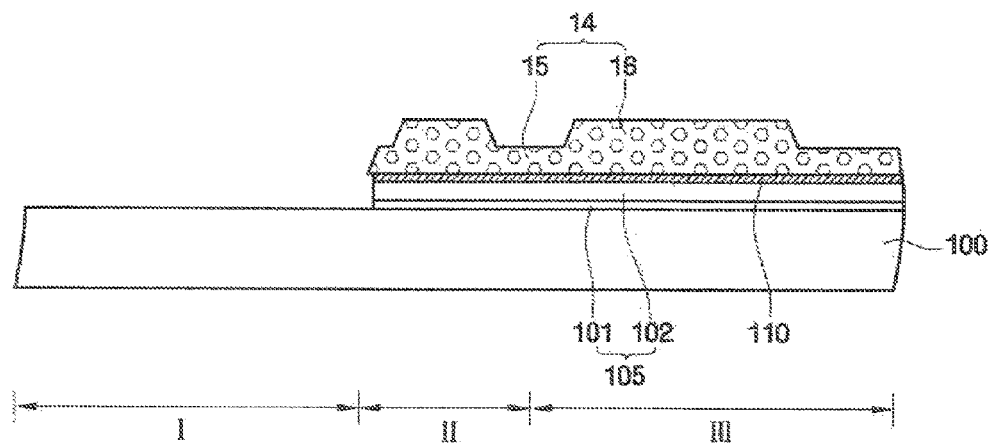

Referring to FIG. 13, the film 110 for forming the semiconductor layer, the second sub-insulating film 102, and the first sub-insulating film 101 in the light-emitting region I is etched using the fourth photoresist pattern 14 as an etch mask.

Figure 14:
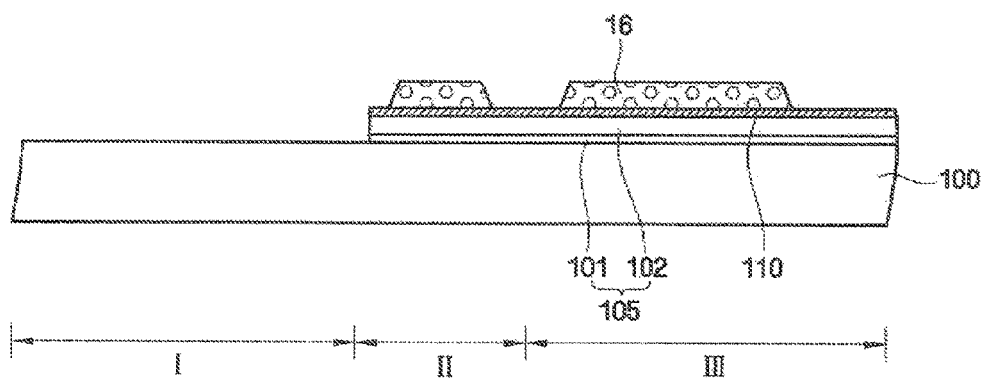

Referring to FIG. 14, the thin region 15 of the fourth photoresist pattern 14 of FIG. 13 is removed while the thick region 16 is left unremoved. The thin region 15 may be removed by an etch-back process or an ashing process using oxygen.

Figure 15:
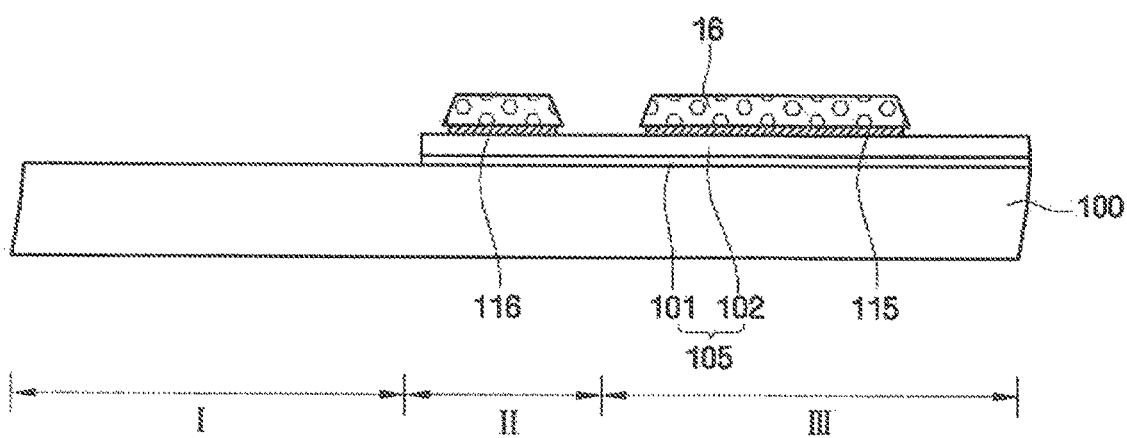

Referring to FIG. 15, the film 110 of FIG. 14 for forming the semiconductor layer is etched using the remaining thick region 16 of the fourth photoresist pattern 14. As a result, the semiconductor layer 115 and the capacitor first electrode 116 are formed.

Referring to FIG. 10, the remaining thick region 16 of the fourth photoresist pattern 14 is removed. Then, a second insulating film 120 and a conductive film 130 for forming a gate electrode are sequentially formed on the entire surface of the substrate 100 having the semiconductor layer 115 and the capacitor first electrode 116. The second insulating film 120 is formed by depositing a third sub-insulating film 121 made of $SiO_2$ on the substrate 100 and depositing a fourth sub-insulating film 122 made of $SiN_x$, SiON or a high-k film on the third sub-insulating film 121. A second photoresist pattern 21 for forming a gate electrode 135 (see FIG. 2) and a capacitor second electrode 136 (see FIG. 2) is formed on the conductive film 130 for forming the gate electrode.

Referring to FIG. 11, the conductive film 130 for forming the gate electrode and the fourth sub-insulating film 122 are etched using the second photoresist pattern 21 as an etch mask. The fourth sub-insulating film 122 may be etched using an etchant or an etching gas having a high etch selectivity with respect to the third sub-insulating film 121.

Referring to FIG. 2, after the second photoresist pattern 21 is removed, a third insulating film 140, source and drain electrodes 151 and 152, respectively, a fourth insulating film 160, a first electrode 170, a fifth insulating film 180, a light-emitting layer 185, and a second electrode 190 are sequentially formed. The above-described method of manufacturing the organic light-emitting display device according to the exemplary embodiment of FIG. 1 can be referred to for a detailed description of a method of forming these elements.

In the current exemplary embodiment, the first and second sub-insulating films 101 and 102, respectively, which may form a resonance structure when left unremoved from the light-emitting region I, are removed from the light-emitting region I using a photoresist pattern which consists of two regions having different thicknesses, and the semiconductor layer 115 and the capacitor first electrode 116 are formed also using this photoresist pattern. Additionally, the fourth sub-insulating film 122 is removed from the light-emitting region I using a photoresist pattern for forming the gate electrode 135 and the capacitor second electrode 136. Therefore, no additional exposure process is required for the removal of the first and second sub-insulating films 101 and 102, respectively, and the fourth sub-insulating film 122.

While the present invention has been particularly shown and described with reference to exemplary embodiments thereof, it will be understood by those of ordinary skill in the art that various changes in form and detail may be made therein without departing from the spirit and scope of the present invention as defined by the following claims. The exemplary embodiments should be considered in a descriptive sense only and not for purposes of limitation.

What is claimed is:

1. An organic light-emitting display device, comprising:
   a substrate in which a light-emitting region and a thin-film transistor (TFT) region are defined; and
   a plurality of insulating films formed on the substrate,
   wherein a refractive index changes at only one of interfaces between insulating films, which correspond to the light-emitting region and which are formed between the substrate and a first electrode of an organic electroluminescence display element, and a refractive index changes at at least two interfaces between insulating films which correspond to the TFT region.

2. The display device of claim 1, wherein the TFT region of the substrate comprises:
   a first insulating film formed on the substrate;
   a semiconductor layer formed on the first insulating film;
   a second insulating film formed on the semiconductor layer;
   a gate electrode formed on the second insulating film;
   a third insulating film formed on the gate electrode;
   source and drain electrodes formed on the third insulating film; and
   a fourth insulating film formed on the source and drain electrodes.

3. The display device of claim 2, wherein the first insulating film comprises a first sub-insulating film and a second sub-insulating film formed sequentially on the substrate, wherein the first sub-insulating film is made of one of $SiN_x$ and SiON, and the second sub-insulating film is made of $SiO_2$.

4. The display device of claim 3, wherein the second insulating film comprises a third sub-insulating film and a fourth sub-insulating film formed sequentially on the semiconductor layer, wherein the third sub-insulating film is made of $SiO_2$, and the fourth sub-insulating film is made of one of $SiN_x$, SiON, and a high-k film.

5. The display device of claim 4, wherein the third insulating film comprises a fifth sub-insulating film and a sixth sub-insulating film formed sequentially on the gate electrode, wherein the fifth sub-insulating film is made of $SiO_2$, and the sixth sub-insulating film is made of one of $SiN_x$ and SiON.

6. The display device of claim 5, wherein the third sub-insulating film directly contacts the substrate in the light-emitting region.

7. The display device of claim 6, wherein the fifth sub-insulating film directly contacts the third sub-insulating film in the light-emitting region.

8. The display device of claim 7, wherein the refractive index changes only at an interface between the fifth sub-insulating film and the sixth sub-insulating film disposed between the substrate and the first electrode of the organic electroluminescence display element in the light-emitting region.

9. The display device of claim 4, wherein the fourth sub-insulating film has a same pattern shape as the gate electrode.

10. The display device of claim 4, wherein the substrate further comprises a capacitor region, and wherein the capacitor region comprises:
    the first and second sub-insulating films formed on the substrate;
    a capacitor first electrode formed on the second sub-insulating film;
    the third and fourth sub-insulating films formed on the capacitor first electrode; and
    a capacitor second electrode formed on the fourth sub-insulating film.

11. The display device of claim 3, wherein the first sub-insulating film and the second sub-insulating film have a same pattern shape as the semiconductor layer.

12. The display device of claim 3, wherein the first and second sub-insulating films comprise regions which protrude from sidewalls of the semiconductor layer.

13. A method of manufacturing an organic light-emitting display device, the method comprising the steps of:
    sequentially forming a first insulating film, which comprises a stack of a first sub-insulating film and a second sub-insulating film, and a film for forming a semiconductor layer on a substrate in which a light-emitting region and a TFT region are defined;
    forming a first photoresist pattern on the film for forming the semiconductor layer;
    etching the film for forming the semiconductor layer, the second sub-insulating film, and the first sub-insulating film using the first photoresist pattern as an etch mask;
    removing the first photoresist pattern and then sequentially forming a second insulating film, which comprises a stack of a third sub-insulating film and a fourth sub-insulating film, and a conductive film for forming a gate electrode on an entire surface of the substrate having a semiconductor layer;
    forming a second photoresist pattern on the conductive film for forming the gate electrode; and
    etching the conductive film for forming the gate electrode and the fourth sub-insulating film using the second photoresist pattern as an etch mask.

14. The method of claim 13, wherein the first sub-insulating film is made of one of $SiN_x$ and SiON, the second and third sub-insulating films are made of $SiO_2$, and the fourth sub-insulating film is made of one of $SiN_x$, SiON, and a high-k film.

15. The method of claim 14, wherein the first photoresist pattern comprises a first region and a second region having different thicknesses, wherein the first region is thicker than the second region, the first region corresponds to a region in which the semiconductor layer is formed, and the second region corresponds to the TFT region excluding the light-emitting region.

16. The method of claim 14, further comprising:
    removing the second photoresist pattern and then forming a third insulating film, which comprises a stack of a fifth sub-insulating film and a sixth sub-insulating film, on the entire surface of the substrate having a gate electrode;
    forming source and drain electrodes on the sixth sub-insulating film; and forming a fourth insulating film on the entire surface of the substrate having the source and drain electrodes.

17. The method of claim 16, wherein the fifth sub-insulating film is made of $SiO_2$, and the sixth sub-insulating film and the fourth insulating film are made of one of $SiN_x$ and SiON.

18. An organic light-emitting display device fabricated by the method of claim 16, wherein a refractive index changes at only one of interfaces between insulating films, which correspond to the light-emitting region and which are formed between the substrate and a first electrode of an organic electroluminescence display element, and a refractive index changes at at least two interfaces between insulating films which correspond to the TFT region.

19. An organic light-emitting display device fabricated by the method of claim 16, wherein the TFT region of the substrate comprises:
- the first insulating film formed on the substrate;
- the semiconductor layer formed on the first insulating film;
- the second insulating film formed on the semiconductor layer;
- the gate electrode formed on the second insulating film;
- a third insulating film formed on the gate electrode;
- source and drain electrodes formed on the third insulating film; and
- a fourth insulating film formed on the source and drain electrodes.

20. The method of claim 15, wherein the first photoresist pattern is formed using a slit mask or a halftone mask.

\* \* \* \* \*